(12) United States Patent
Kandianis

(10) Patent No.: US 11,358,870 B2
(45) Date of Patent: Jun. 14, 2022

(54) CRYSTALLINE MAGNESIUM OXIDE CARBON COMPOSITES

(71) Applicant: SHELL OIL COMPANY, Houston, TX (US)

(72) Inventor: Michael Kandianis, Houston, TX (US)

(73) Assignee: SHELL USA, INC., Houston, TX (US)

( * ) Notice: Subject to any disclaimer, the term of this patent is extended or adjusted under 35 U.S.C. 154(b) by 147 days.

(21) Appl. No.: 16/863,165

(22) Filed: Apr. 30, 2020

(65) Prior Publication Data

US 2020/0346931 A1 Nov. 5, 2020

Related U.S. Application Data

(60) Provisional application No. 62/841,023, filed on Apr. 30, 2019.

(51) Int. Cl.

| | |
|---|---|
| *C01B 32/184* | (2017.01) |
| *C01F 5/02* | (2006.01) |
| *H01L 29/08* | (2006.01) |
| *H01M 4/48* | (2010.01) |
| *B01J 21/10* | (2006.01) |
| *B01J 37/34* | (2006.01) |
| *C01B 32/205* | (2017.01) |
| *B82Y 30/00* | (2011.01) |
| *B82Y 40/00* | (2011.01) |

(52) U.S. Cl.
CPC ............. *C01B 32/184* (2017.08); *B01J 21/10* (2013.01); *B01J 37/341* (2013.01); *C01B 32/205* (2017.08); *C01F 5/02* (2013.01); *H01L 29/0843* (2013.01); *H01M 4/48* (2013.01); *B82Y 30/00* (2013.01); *B82Y 40/00* (2013.01); *Y02E 60/10* (2013.01)

(58) Field of Classification Search
None
See application file for complete search history.

(56) References Cited

U.S. PATENT DOCUMENTS

| | | | |
|---|---|---|---|
| 5,252,499 | A | 10/1993 | Rothschild |
| 7,115,461 | B2 | 10/2006 | Anthony et al. |
| 8,017,981 | B2 | 9/2011 | Sankin et al. |
| 8,039,792 | B2 | 10/2011 | Nikitin et al. |
| 8,652,957 | B2 | 2/2014 | Ahn et al. |
| 8,940,446 | B1 | 1/2015 | Holme et al. |
| 9,006,094 | B2 | 4/2015 | Jagannathan et al. |

(Continued)

FOREIGN PATENT DOCUMENTS

CN 104591233 A * 5/2015

OTHER PUBLICATIONS

English machine translation of Guo et al. (CN 104591233 A), Description and Claims, accessed online from Espacenet, PDF pp. 1-11 are attached for reference. (Year: 2015).*

(Continued)

*Primary Examiner* — Katie L. Hammer
(74) *Attorney, Agent, or Firm* — Shell USA, Inc.

(57) ABSTRACT

Carbon dioxide can be converted into a higher energy product by contacting carbon dioxide with a polarized monocrystalline magnesium oxide producing at least in part carbon. Further a novel crystalline magnesium oxide carbon composite comprising crystalline magnesium oxide and crystalline carbon having graphene structure which are interwoven is provided.

6 Claims, 3 Drawing Sheets

(56) References Cited

U.S. PATENT DOCUMENTS

| | | |
|---|---|---|
| 9,263,894 B2 | 2/2016 | Robinett, III et al. |
| 2013/0295000 A1* | 11/2013 | Dickinson .............. C01G 23/07 423/448 |
| 2015/0210558 A1* | 7/2015 | Dickinson ................ C01F 5/30 423/600 |
| 2019/0036171 A1 | 1/2019 | Dahn et al. |

OTHER PUBLICATIONS

Yadavalli et al. "Low-temperature growth of MgO by molecular-beam epitaxy", Physical Review B, vol. 41, No. 11, Apr. 15, 1990—I; pp. 7961-7693, copyright 1990 to the American Physical Society. (Year: 1990).*

\* cited by examiner

CRYSTALLINE MAGNESIUM OXIDE CARBON COMPOSITES

CROSS-REFERENCE TO RELATED APPLICATION

This application claims the benefit of U.S. Provisional Patent Application No. 62/841,023, filed Apr. 30, 2019, which is incorporated by reference herein in its entirety.

FIELD OF THE INVENTION

This invention relates to crystalline magnesium oxide carbon composites and a method of production thereof from $CO_2$.

BACKGROUND OF THE INVENTION

Electrocatalysis and thermolysis are widely practiced means of converting carbon dioxide ($CO_2$) into useful products. Still such pathways must either overcome the significant barrier to $CO_2$ reduction (3-4 eV) via the use of high-cost materials (e.g. metals and rare earth elements) or require the continuous input of energy (e.g. temperatures exceeding 300° C.) into the process at levels that inevitably reduce energy efficiency.

Monocrystalline Magnesium Oxide (MgO, Periclase), like other rocksalt-structured oxides of the Fm3m space group, exhibits a bulk centrosymmetric character with mirror symmetry along the 110 plane. The cubic close packed arrangement of MgO arises from repeating layers of interpenetrating octahedra wherein Mg atoms or O atoms rest in six-fold coordination to each other. Slight distortions within the oxygen sublattice of natural MgO produce non-zero electric fields within the crystalline bulk of this oxide; as such, natural MgO exhibits persistent charge density at its surface termini Natural MgO is an earth abundant mineral that is widely available at relatively lower cost. However, natural MgO is not known to produce higher energy products from $CO_2$ and most reactions involving $CO_2$ and magnesium oxide produce stable carbonates, such as magnesite.

Investigations of the MgO electronic structure confirm that the unequal distribution of charge within the crystalline bulk of this material supports spontaneous polarization. Anecdotal reports of currents operating at the MgO surface have also been noted over many decades, especially under conditions when the material undergoes polarization. The lack of a conclusive understanding of what motivates the generation of these currents in MgO and the relatively low energy flux available from natural MgO have inhibited its use in processes requiring the production of carbon products from $CO_2$ and have limited the use of MgO as a component in electronic materials.

SUMMARY OF THE INVENTION

It has been found that an electron beam can transform monocrystalline magnesium oxide into a polarized form of the magnesium oxide. Further, a novel crystalline magnesium oxide and carbon composite can be produced by bringing $CO_2$ into contact with the polarized crystalline magnesium oxide. Such novel crystalline magnesium oxide carbon composites can be useful as a component in energy storage devices, as wide band gap semiconductors and as gate dielectrics due to its enhanced conductivity and low dielectric loss.

In an embodiment, a process of producing crystalline carbon from carbon dioxide is provided, comprising:
polarizing monocrystalline magnesium oxide by contacting monocrystalline magnesium oxide with an electron beam thereby producing a polarized monocrystalline magnesium oxide having a purity of at least 98% and an emergent electron velocity of at least $10^{-8}$ meters per second; and
contacting carbon dioxide with a polarized monocrystalline magnesium oxide thereby producing at least in part crystalline carbon with a graphene structure.

In an embodiment, the polarized monocrystalline magnesium oxide described herein has a purity of at least 99%.

In an embodiment, the step of contacting carbon dioxide with a polarized monocrystalline magnesium oxide is carried out at ambient temperature.

In an embodiment, the step of contacting carbon dioxide with a polarized monocrystalline magnesium oxide is carried out at ambient pressure.

In an embodiment, the polarized monocrystalline magnesium oxide described herein has an emergent electron velocity of at least $10^{-5}$ meters per second.

In an embodiment, the polarized monocrystalline magnesium oxide described herein has an emergent electron velocity of at least $10^{-3}$ meters per second.

In an embodiment, a crystalline magnesium oxide carbon composite is provided, wherein the composite comprises polarized crystalline magnesium oxide and crystalline carbon having graphene structure which are interwoven.

In an embodiment, the crystalline magnesium oxide carbon composite described herein has a ratio of crystalline magnesium oxide and crystalline carbon is in the range of 999:1 to 1:55 in molar ratio.

In an embodiment, an energy storage device is provided, wherein the energy storage device comprises at least one of electrodes, electrolytes, binders, or combinations thereof comprising the crystalline magnesium oxide carbon composite described herein.

In an embodiment, a wide band gap semiconductor is provided, comprising the crystalline magnesium oxide carbon composite described herein.

In an embodiment, a gate dielectric is provided, comprising the crystalline magnesium oxide carbon composite described herein.

The features and advantages of the invention will be apparent to those skilled in the art. While numerous changes may be made by those skilled in the art, such changes are within the spirit of the invention.

BRIEF DESCRIPTION OF THE DRAWINGS

The drawings illustrate certain aspects of some of the embodiments of the invention, and should not be used to limit or define the invention

DETAILED DESCRIPTION OF THE INVENTION

Figure 1A:
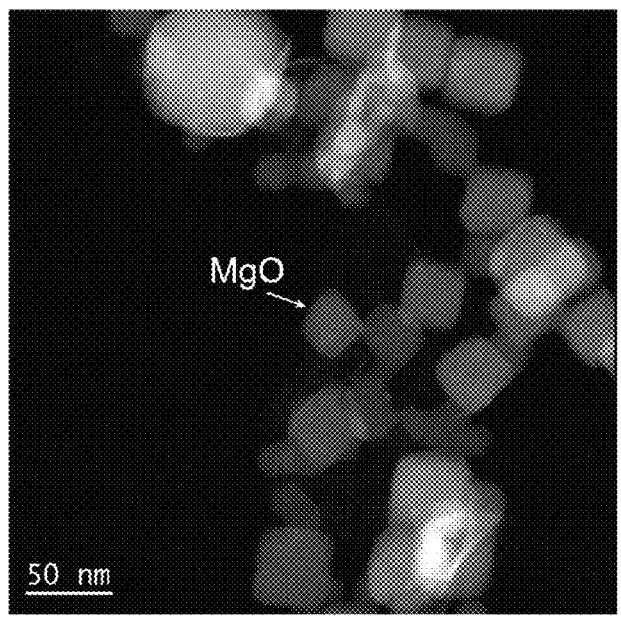
FIG. 1a is Transmission Electron Micrographs of MgO crystals without electron beam bombardment after exposure to $CO_2$.
Figure 1B:
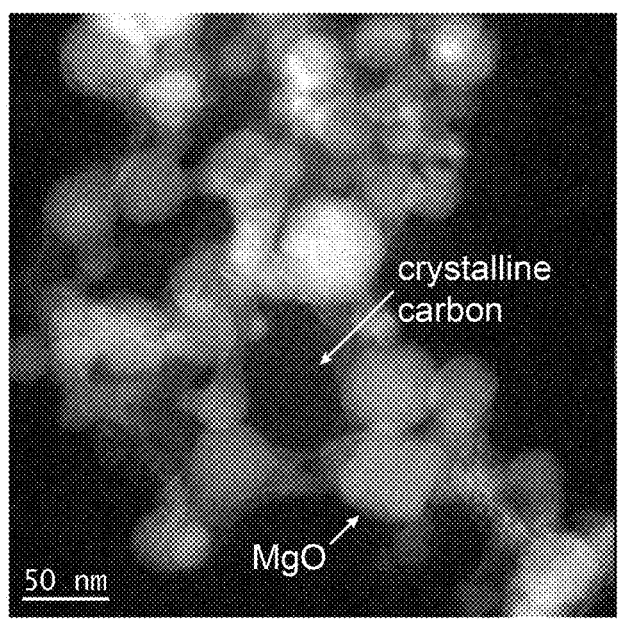
FIG. 1b is Transmission Electron Micrographs of polarized MgO crystals with precipitated carbon after exposure to $CO_2$.

It has been found that the energy barrier to form crystalline carbon from $CO_2$ can be overcome by placing a crystalline magnesium oxide in the path of an electron beam thereby polarizing the crystal which enables the production of crystalline carbon from $CO_2$ as $CO_2$ comes into coulombic contact with the polarized crystal. It has been found that rapid transformation of concentrated $CO_2$ gas to products at room temperature can be achieved by using the polarized crystalline magnesium oxide produced by bombarding natural MgO with relativistic electrons in a certain process. This inventive process allows energy efficient conversion of $CO_2$ to products such as carbon (preferably with graphene structure such as graphene and/or graphite). The efficiency range for this process is from 1.5 percent, preferably from 15 percent, to upwards of one hundred percent. This method provides a novel method to make novel crystalline magnesium oxide carbon composites.

The polarized monocrystalline or single crystalline magnesium oxide can be prepared by a certain electron bombardment process as described below in the Illustrative example. The polarized monocrystalline magnesium oxide has a velocity of at least $10^{-8}$ meters per second, preferably at least $10^{-7}$ meters per second, or alternatively, at least $10^{-6}$, $10^{-5}$, $10^{-4}$, or $10^{-3}$ meters per second.

The polarized monocrystalline or single crystalline magnesium oxides have a purity of at least 98%, preferably have a purity of at least 99%, more preferably at least 99.3%, at least 99.5%, and at least 99.7%. The purity is such that it is undoped, meaning no other added metals, metalloids, alkali-metal or semi-metals beyond natural impurities.

According to one embodiment of the present invention, the process to produce crystalline carbon from carbon dioxide comprises contacting carbon dioxide with a polarized monocrystalline magnesium oxide described above thereby producing at least in part carbon. The carbon dioxide is typically concentrated, preferably over 1% by volume, and gaseous. It has been further found that crystalline carbon having graphene structure may be produced to form a crystalline magnesium oxide carbon composite with polarized crystalline magnesium oxide and crystalline carbon having graphene structure which are interwoven. By the term interwoven, the magnesium oxide crystals and carbon crystals are intertwined or intermingled and not in a layered structure.

The process disclosed herein can be conducted at room temperature (ambient temperature) and at atmospheric pressure (ambient pressure), although the temperature and pressure may vary according to or similar to variance in temperature and pressure depending on the location. Further the rate and duration of carbon dioxide exposure may vary the ratio of magnesium oxide crystals to carbon crystals. The ratio may vary from magnesium oxide crystals to carbon crystals in the range of 999:1 to 1:55, based on molar ratio. The process can initiate the steady conversion of $CO_2$ to crystalline carbon until a point where the transport of electrons from the monocrystalline magnesium oxide reach velocities typical of natural MgO.

The crystalline magnesium oxide carbon composites may be incorporated into various devices that require enhanced electrical conductivity. This novel crystalline magnesium oxide carbon composites may be useful as a component in energy storage devices, as a wide band gap semiconductor, and as a gate dielectric due to its enhanced conductivity and low dielectric loss.

Figure 3:
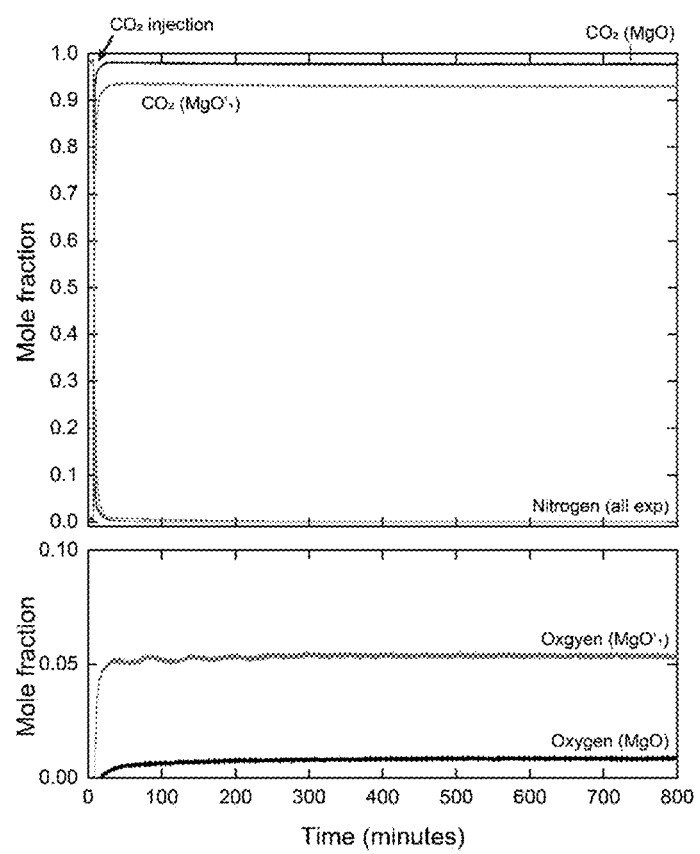
FIG. 3 is a pair of graphs, the top graph showing carbon dioxide conversion versus time measured by in situ mass spectrometry for MgO without electron bombardment as compared to polarized MgO after electron bombardment ($MgO'_1$). The bottom graph of FIG. 3 is a graph showing carbon dioxide conversion via oxygen evolution over time measured by in situ mass spectrometry for MgO without electron bombardment as compared to polarized MgO after electron bombardment ($MgO'_1$).

For example, an energy storage device can contain at least one of electrodes, electrolytes, binders, or combinations thereof, such electrodes, electrolytes, binders or combinations thereof containing the crystalline magnesium oxide carbon composites described above. The electrodes may be either cathodes or anodes. Electrolytes are media for transferring ions and/or electrons between contacts, electrodes or plates. Electrolytes can also be referred to as the dielectric in certain devices. Binder refers to a material that separates an anode or a cathode from the electrolyte in the energy storage devices. The use of the crystalline magnesium oxide carbon composites within energy storage devices would avert the breakdown of the battery architecture that invariably results from cycling charge. As shown in FIG. 3, the polarized monocrystalline magnesium oxide can stably produce carbon from $CO_2$. The crystalline carbon produced from $CO_2$ is a requirement for the stable operation of batteries, capacitors and hybrid storage devices. The enhanced conductivity of the crystalline magnesium oxide carbon composites can provide improved charging efficiency and may be incorporated into binder materials to allow charge transfer reactions to proceed at accelerated rates so that ions or electrons are quickly generated or consumed in energy storage devices. Examples of energy storage devices can be found in U.S. Pat. No. 9,263,894, entire disclosures are hereby incorporated by reference, and more specifically such as in batteries can be found in U.S. Pat. No. 8,940,446, US patent publication no. 20190036171, entire disclosures are hereby incorporated by reference.

For example, a wide band gap semiconductor can contain the crystalline magnesium oxide carbon composites described above. Wide band gap semiconductors are essential materials for high voltage power transmission and the production of semiconductor lasers. Employing crystalline magnesium oxide carbon composites as a wide band gap semiconductor provides a new material with high breakdown voltage that exhibits lower Joule heating during operation, which is particularly important for materials exposed to substantial electric fields. These characteristics enable improved management of power switching and reduced energy dissipation during transmission as well as operational efficiency at higher temperatures. Examples of wide bandgap semiconductors can be found in U.S. Pat. Nos. 5,252,499, 8,039,792, 8,017,981, entire disclosures are hereby incorporated by reference. These devices can be used as power electronics for example in automotives, data centers, aerospace, and distributed energy resources.

For example, a gate dielectric can contain the crystalline magnesium oxide carbon composites described above. A gate dielectric is an essential component of field effect transistors that ensures the efficient transfer of energy from its source to its drain. By using the crystalline magnesium oxide carbon composites of the invention as a gate dielectric instead of, for example, $SiO_2$, dielectric losses in transistors are reduced thereby extending the lifetime of these devices. Examples of gate dielectric can be found in U.S. Pat. Nos.

7,115,461, 8,652,957, 9,006,094, entire disclosures are hereby incorporated by reference.

While the invention is susceptible to various modifications and alternative forms, specific embodiments thereof are shown by way of examples herein described in detail. It should be understood, that the detailed description thereto are not intended to limit the invention to the particular form disclosed, but on the contrary, the intention is to cover all modifications, equivalents and alternatives falling within the spirit and scope of the present invention as defined by the appended claims. The present invention will be illustrated by the following illustrative embodiment, which is provided for illustration only and is not to be construed as limiting the claimed invention in any way.

ILLUSTRATIVE EXAMPLES

Method of preparing a polarized monocrystalline magnesium oxide and subsequent production of a crystalline magnesium oxide carbon composition of the invention is provided below.

Methods

Electron Bombardment and In Situ TEM Coupled to Mass Spectrometry to Determine the Influence of MgO on Carbon Dioxide Conversion MgO nanocrystals (UBE Material Industries) were either drop-cast in ethanol or deposited dry onto a DENS Solutions (Delft, the Netherlands) nanoreactor chip. The amount of MgO nanocrystals was controlled by varying the nanocrystal:ethanol ratio in the stock solution prior to drop-casting. Vacuum testing ensured that no leaks occurred within the nanoreactor. Upon successful assembly, the nanoreactor was inserted into a FEI Titan cubed (Cs-corrected) TEM located at the National Centre for High Resolution Electron Microscopy (TU Delft). Using the DENS Solutions climate control system, the nanoreactor assembly was flushed with $N_2$ gas (28 AMU) and brought to a stable temperature of 25° C. Upon temperature stabilization the nanoreactor was pumped to vacuum. Electron-transparent windows within the nanoreactor were exposed to specific electron dose rates that ranged from 125 electrons per nanometer square second over periods varying from 24 to 55 seconds (electron doses at given currents were known due to prior calibration of the TEM) or in the case of control experiments were not exposed to electron beam current. During each experiment wherein MgO was contacted by the electron beam, one window was kept unexposed to electrons for comparison, acting as an in situ blank. Subsequent to electron bombardment, isotopically enriched $N_2$ gas (30 AMU; Sigma Aldrich) was injected into the nanoreactor with a flow rate of 0.21 ml/min to reach an internal reactor pressure of 0.1 MPa. Upon stabilization of the $N_2$ gas pressure, the gas control system was set to transition to UHP (ultra-high purity) $CO_2$ at an equivalent flow rate of 0.21 ml/min $CO_2$ gas was flushed through the nanoreactor and brought into contact with the MgO nanocrystals for a duration of 0.5 hours to upwards of 14 hours. At all times after the initial electron bombardment and throughout the run of the gas injection experiment, the nanoreactor was left unexposed to the electron beam. The abundance of different gases in the reactor outflow was monitored throughout the entire experimental duration using a quadrupole mass spectrometer system (Stanford Research Residual Gas Analyzer). The spectrometer continuously monitored the ion currents at 2, 16, 18, 28, 30, 32 and 44 AMU, corresponding to signals from $H_2$, O, $H_2O$, $N_2$, isotopically enriched $N_2$, $O_2$ and $CO_2$. The use of isotopically enriched $N_2$ allowed the clear discrimination between gas derived from the experimental setup and any contamination from atmospheric nitrogen and fragmentation of $CO_2$ in the mass spectrometer. The seven ion currents were recorded with a 1 s sampling period. To quantify and correct for any fragmentation processes within the mass spectrometer and to obtain a gas blank without the influence of the reactor contents, we conducted an experiment at equivalent conditions, but without any nanocrystals present. At the end of each experiment the $CO_2$ gas was exchanged with conventional $N_2$ gas until a stable pressure inside the nanoreactor was reached. Subsequently the nanoreactor was evacuated to vacuum conditions. Post-experimental imaging of the MgO nanocrystals was carried out either using low-dose, bright-field TEM imaging or high-angle annular dark-field imaging (HAADF) employing the scanning mode of the TEM (STEM). Electron energy loss spectroscopy (EELS) was carried out both in TEM and STEM mode at 300 kV using a post-column Gatan EELS spectrometer. The energy resolution of EELS analyses was 0.7 eV, measured at the full width half maximum (FWHM) of the zero-loss peak. Measurement times of the electron energy loss spectra were set to 1-5 s with 1-5 frames/spectra, a binning of 4 (=1024 pixel) resulting in an energy range of 102.4 eV at an energy spread of 0.01 eV/pixel. We ran a series of experiments to determine the potential influence of beam-induced carbon contamination on our experimental results. No carbon contamination was found in any experiment at the chosen level of electron beam exposure; however when the bottom SiN window of the nanoreactor chip received a focused electron beam (250 nm beam diameter) for 100 s with an area specific power that is 20,000-fold greater a discrete carbon precipitate was identified. EELS measurements were used to confirm that this precipitate is of amorphous nature and clearly different from the crystalline carbon that envelops the MgO nanocrystals during our experiments.

In FIG. 1(a) shows a transmission electron micrograph of natural MgO nanocrystals without electron beam bombardment post exposure to $CO_2$ for a period of 3.5 h, and (b) depicts the polarized MgO nanocrystals with precipitated carbon after exposure to $CO_2$. The interwoven nature of the novel crystalline magnesium oxide carbon composite is apparent. These results clearly demonstrate that $CO_2$ can be converted to solid phase crystalline carbon as the molecule interacts with the polarized MgO, whereas natural MgO has insufficient energy flux to initiate the formation of crystalline carbon from $CO_2$.

Figure 2A:
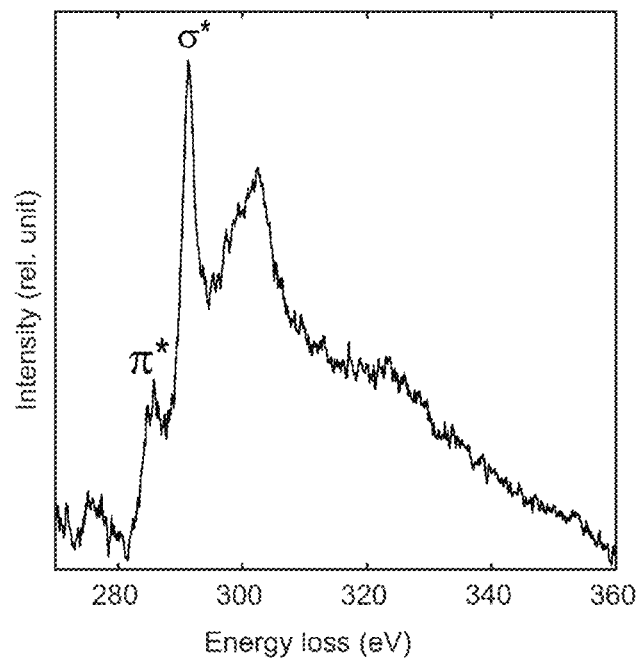
FIG. 2a is a graph showing the dependence of spectral intensity on electron energy loss as measured by electron energy loss spectroscopy (EELS) for the crystalline magnesium oxide carbon composite
Figure 2B:
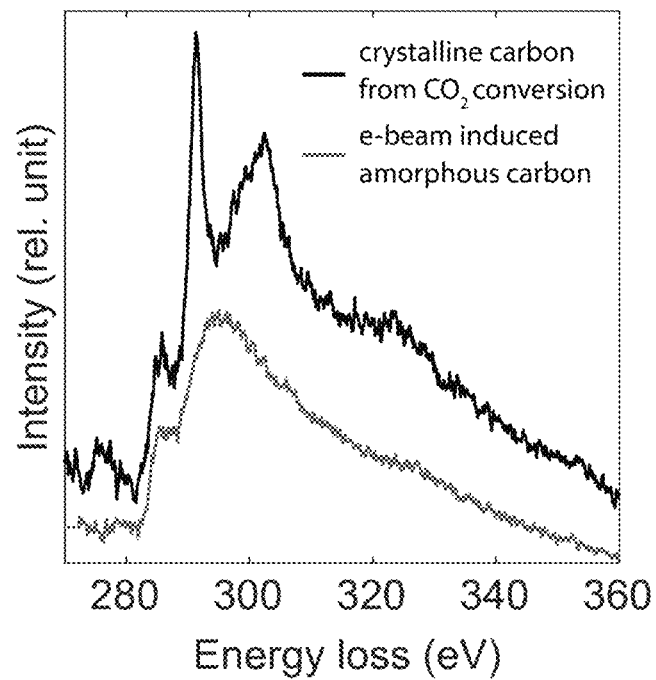
FIG. 2b is a graph showing the dependence of spectral intensity on electron energy loss as measured by electron energy loss spectroscopy (EELS) for amorphous carbon induced by the electron beam.

In FIG. 2(a) reveals the dependence of spectral intensity on electron energy loss as measured by electron energy loss spectroscopy (EELS) for the crystalline magnesium oxide carbon composite. Large spectral peaks (284 eV and 291 eV, $\pi^*$ and $\sigma^*$ peaks respectively) coincident with core electron loss energies in the carbon region demonstrate the presence of $sp^2$ bonding that is characteristic of crystalline graphene/graphite, a hexagonal allotrope of elemental carbon. (b) displays the dependence of spectral intensity on electron energy loss as measured by electron energy loss spectroscopy (EELS) for the crystalline carbon and amorphous carbon induced by the electron beam. The spectral differences reveal that the intrinsic crystalline structure of the crystalline magnesium oxide carbon composite is quite distinct from phases developed via contamination.

In FIG. 3, the top graph depicts the evolution of carbon dioxide ($CO_2$) and Nitrogen over a 13.3 hour period during in situ gas-cell transmission electron microscopy (TEM) $CO_2$ conversion experiments with non-polarized (MgO) and polarized (MgO'$_1$) nanocrystalline magnesium oxide. In FIG. 3, the bottom graph shows the evolution of Oxygen during the $CO_2$ conversion experiments with non-polarized (MgO) and polarized ($MgO'_1$) nanocrystalline magnesium oxide conducted within the in situ transmission electron microscopy (TEM) gas-cell. Continual conversion of greater than five percent of the influent carbon dioxide gas to crystalline carbon for the entirety of the 13.3 hour period within the in situ TEM reactor demonstrates the conversion potential of polarized magnesium oxide. Black curves depicted as "MgO" are mole fractions determined for experiments conducted with magnesium oxide nanocrystals that were not subjected to any electron beam current. Grey curves labelled "$MgO'_1$" are mole fractions determined for gas experiments where the MgO nanocrystals were exposed to electron beam doses as described in the example. All curves were corrected for molecular fragmentation of $CO_2$ within the inline mass spectrometer using a gas-cell experiment without any MgO nanocrystals (blank). Uncertainties in the data are taken to be equivalent to the precision of the mass spectrometer.

I claim:

1. A process of producing crystalline carbon from carbon dioxide comprising:

polarizing monocrystalline magnesium oxide by contacting monocrystalline magnesium oxide with an electron beam thereby producing a polarized monocrystalline magnesium oxide having a purity of at least 98% and an emergent electron velocity of at least $10^{-8}$ meters per second; and contacting carbon dioxide with the polarized monocrystalline magnesium oxide thereby producing at least in part crystalline carbon with graphene structure.

2. The process of claim 1 wherein the polarized monocrystalline magnesium oxide has a purity of at least 99%.

3. The process of claim 1 wherein the contacting is carried out at ambient temperature.

4. The process of claim 3 wherein the contacting is carried out at ambient pressure.

5. The process of claim 1 wherein the polarized monocrystalline magnesium oxide has an emergent electron velocity of at least $10^{-5}$ meters per second.

6. The process of claim 1 wherein the polarized monocrystalline magnesium oxide has an emergent electron velocity of at least $10^{-3}$ meters per second.

* * * * *